United States Patent [19]

Chao-Fan Chu et al.

[11] Patent Number: 5,097,385
[45] Date of Patent: Mar. 17, 1992

[54] SUPER-POSITION COOLING

[75] Inventors: Richard Chao-Fan Chu; Robert E. Simons, both of Poughkeepsie; David T. Vader, New Paltz, all of N.Y.

[73] Assignee: International Business Machines Corporation, Armonk, N.Y.

[21] Appl. No.: 510,756

[22] Filed: Apr. 18, 1990

[51] Int. Cl.$^5$ .............................................. H05K 7/20
[52] U.S. Cl. ................................. 361/382; 165/80.4; 165/104.33; 174/16.3; 361/385
[58] Field of Search ........................... 361/382–388; 174/16.3; 357/81, 82; 165/80.3, 80.4, 104.33, 908, 185

[56] References Cited

U.S. PATENT DOCUMENTS

| | | | |
|---|---|---|---|
| 4,138,692 | 2/1979 | Meeker et al. | 357/82 |
| 4,203,129 | 5/1980 | Oktay | 357/82 |
| 4,226,281 | 10/1980 | Chu | 165/80 |
| 4,277,816 | 7/1981 | Dunn et al. | 361/384 |
| 4,291,364 | 9/1981 | Andros et al. | 361/384 |
| 4,296,455 | 10/1981 | Leaycraft et al. | 361/383 |
| 4,491,171 | 1/1985 | Bland et al. | 361/386 |
| 4,561,040 | 12/1985 | Eastman et al. | 361/385 |
| 4,800,956 | 1/1989 | Hamburger | 165/185 |
| 4,928,207 | 5/1990 | Chrysler | 361/385 |
| 4,951,740 | 8/1990 | Peterson | 165/32 |

OTHER PUBLICATIONS

Integrated-Structure, Pascuzzo, IBM Tech. Discl. Bull. vol. 20, No. 10, Mar. 1978, pp. 3898.
Multi-Chip-Pins, IBM Tech. Discl. Bull. vol. 31, No. 5, Oct. 1988, pp. 141.
IBM Technical Disclosure Bulletin, vol. 13, No. 2 Jul. 1970, p. 442. entitled "Conduction Cooled Heat Plate . . . Package" by Dombrowskas et al.
IBM Technical Disclosure Bulletin, vol. 21, No. 2, Jul. 1978, pp. 752-753, entitled "Conduction Cooling" by R. C. Chu.
IBM Technical Disclosure Bulletin, vol. 27, No. 12, May 1985, p. 6898, entitled "Thermal Conduction Module . . .ONto The Chip" by R. C. Chu.
IBM Technical Disclosure Bulletin, vol. 29, No. 7, Dec. 86, entitled "Liquid-Cooled Circuit Package With . . .From The Jet", by V. Antonelli et al.
Article entitled "Cooling of High Power Density Electronic Chips" by G. M. Chrysler et al., pp. 881-887, appearing in vol. 35A of Advances in Cryogenic Engineering, by R. W. Fast, Editor.

Primary Examiner—Gerald P. Tolin
Attorney, Agent, or Firm—Richard M. Ludwin

[57] ABSTRACT

A system and method of cooling which uses both jet impingement and conduction cooling. Conduction cooling is accomplished by placing a cluster of pistons in contact with each chip. The pistons have a rectangular foot at the bottom which contacts the chip. A dielectric coolant, such as liquid nitrogen or fluorocarbon is delivered at the center of each cluster, the fluid flows over the top of the feet, and in the channels between the feet, providing jet enhanced convective cooling at the lower portion of the pistons. Advantageously, the pistons serve as extended surfaces which increase the area over which the forced convection cooling occurs. In a preferred embodiment, microfins protruding from the header sections of each piston further increase the area for heat transfer. In addition, for non-boiling applications, grooves are added to the piston foot surface that contact the chip to insure wetting of the chip-piston interface. The upper portion of the pistons are also immersed in and therefore cooled by the dielectric coolant.

18 Claims, 9 Drawing Sheets

SUPER-POSITION COOLING

BACKGROUND OF THE INVENTION

1. Field of the Invention

This invention relates to heat transfer mechanisms and more particularly heat transfer mechanisms for removing the heat generated in an electronic circuit module assembly.

2. Related Art

The efficient extraction of heat from electronic circuit modules for very large scale integrated circuit (VLSI) packages has presented a significant limitation on the design and use of such electronic modules. The power consumed in the integrated circuits generates heat which must in turn be removed from the VLSI package. Lacking an efficient heat transfer mechanism, the speed, reliability and power capabilities of the electronic circuit modules are severely limited. As the density of circuits within VLSI chips has increased, the need for improved heat extraction has become even more acute since the more densely packed chips tend to have a higher need for heat dissipation per unit area.

One conventional means of heat extraction has been through the use of a gas encapsulated thermal conduction module of the type described in U.S. Pat. No. 4,266,281. In FIG. 1, there is shown a cross sectional view of a prior art gas encapsulated thermal conduction module 10. The thermal conduction module 10 provides cooling of the integrated circuit chips 12 contained therein. The chips 12 are mounted on one side of a substrate 14, generally made of ceramic, which has pins 16 extending from the other side thereof. The pins 16 provide for the plugging of the module into a board (not shown) which may carry auxiliary circuits, etc. A housing cap 18 is attached to the substrate 14 by means of a flange 20 which extends from the periphery of the substrate 14 to the cap 18. The cap 18 is made of a good heat conductive material such as copper or aluminum. The cap 18 has small cylindrical openings 22 located therein, which are arranged in 3 by 3 arrays directly adjacent to the exposed surface of each chip 12. The openings 22 contain pistons 24 opposite each of the chips 12 in the module. The pistons 24 are made of a good heat conducting material such as aluminum or copper or alloys thereof. The cap 18 is in contact with a cold plate 30 which includes a channel 32 suitable for carrying a fluid coolant such as water.

Each of the pistons 24 has a head or header 26 at the end which contacts the surface of the chip 12 when the pin-piston is inserted into the adjacent opening 22 within the housing 18. A spring 27 is included between the housing 18 and the piston 24 to give a small force of the header 26 against the surface of the chip 12. The force exerted by the spring pressure is such that it will not cause the solder balls 28 on which the chips 12 are mounted to change shape.

In operation, heat generated by the chips 12 is extracted by the headers 26 and conducted by the pistons 24 to the cap 18 and the cold plate 30. As coolant flows through the channel 32, it carries heat away from the cold plate 30, thereby extracting heat from the integrated circuit chips 12 within the thermal conduction module 10. An example of a thermal conduction module is disclosed in U.S. Pat. No. 4,226,281.

While the above-described conduction cooling system has provided a successful solution to date, it is believed that the next generation of VLSI circuits may push pure conduction cooling beyond its ability to efficiently extract heat from the chips. In order to provide cooling solutions for the next generation of chips, it has been proposed to modify the thermal conduction module to use a coolant jet which impinges in a heat sink held against the semiconductor chip which is sealed from the jet. An example of such a proposal is described in IBM Technical Disclosure Bulletin, Volume 29, No. 7, December 1986, Pg. 2887, entitled "LIQUID-COOLED CIRCUIT PACKAGE WITH JET IMPINGING ON HEAT SINK HELD AGAINST SEMICONDUCTOR CHIP THAT IS SEALED FROM THE JET".

One problem with such a solution is that the sealant between the coolant and the semiconductor chips can break down. Since the above-described system is designed for use with a non-dielectric coolant, a breakdown in the seal would allow the coolant to damage the semiconductor chips. Another problem with such a system is that any barrier between the coolant and the chips (such as the sealant itself) will impede heat transfer, thereby impairing some of the benefits which might otherwise be achieved by direct impingment of the jet on the chip.

DOCUMENTS INCORPORATED BY REFERENCE

U.S. Pat. No. 4,226,281 to Chu and IBM Technical Disclosure Bulletin, Volume 29, No. 7, December 1986, Pg. 2887, entitled "LIQUID-COOLED CIRCUIT PACKAGE WITH JET IMPINGING ON HEAT SINK HELD AGAINST SEMICONDUCTOR CHIP THAT IS SEALED FROM THE JET" are both incorporated by reference herein as if printed in full below.

SUMMARY OF THE INVENTION

It is an object of the present invention to provide an improved heat extraction mechanism. The foregoing object is achieved through a system and method of cooling which uses both jet impingement and conduction cooling. Conduction cooling is accomplished by placing a cluster of pistons in contact with each chip. The pistons each have a rectangular header at the bottom which contacts the chip. A dielectric coolant is delivered to each cluster from a channel positioned at the center of each cluster, and/or by way of a channel located above each piston. The coolant flows over the top of the feet, and in the channels between the feet, thus providing jet enhanced convective cooling at the lower portion of the pistons. Advantageously, the pistons serve as extended surfaces which increase the area over which the forced convection cooling occurs.

In a preferred embodiment, microfins protruding from the header and upper sections of each piston further increase the area for heat transfer. In addition, for non-boiling applications, groove are added to the piston header surfaces that contact the chip to insure wetting of the chip-piston interface. The upper and header portions of the pistons are immersed in and therefore cooled by the dielectric coolant.

DESCRIPTION OF THE DRAWINGS

In FIGS. 2–7, the coolant flow is indicated by arrows.

Like components appearing in more than one Figure are designated by like reference numerals.

DESCRIPTION OF THE PREFERRED EMBODIMENTS

Figure 1:
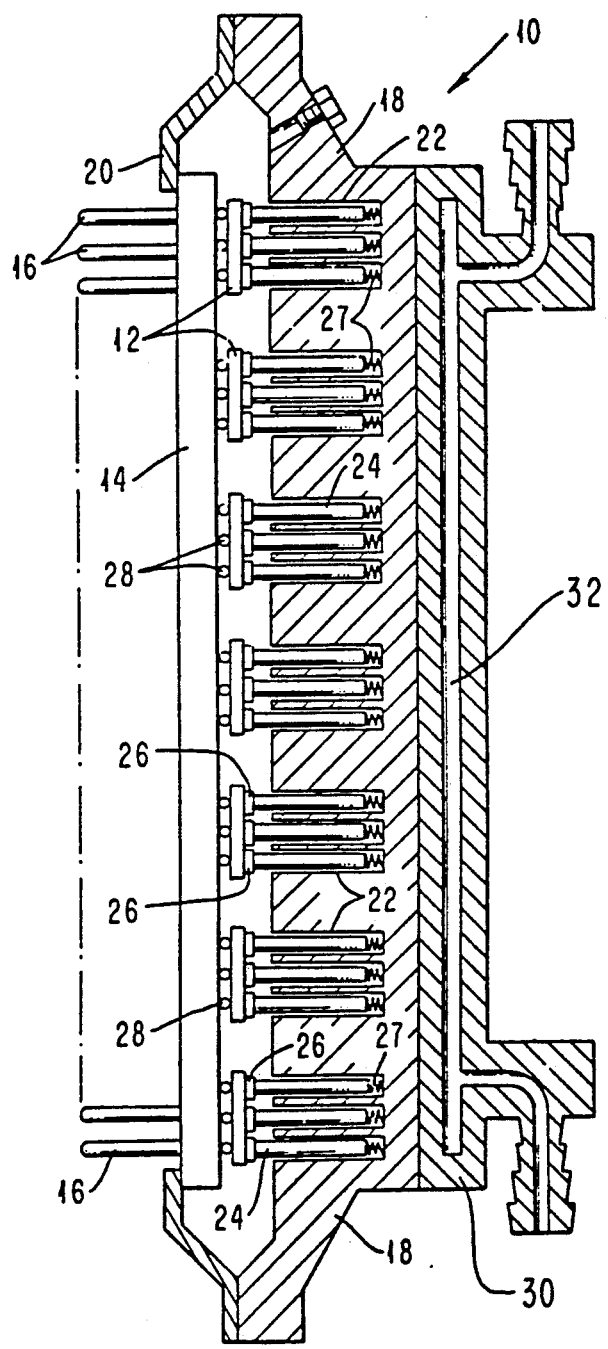
FIG. 1 is a cross sectional view of a prior art thermal conduction module.
Figure 2:
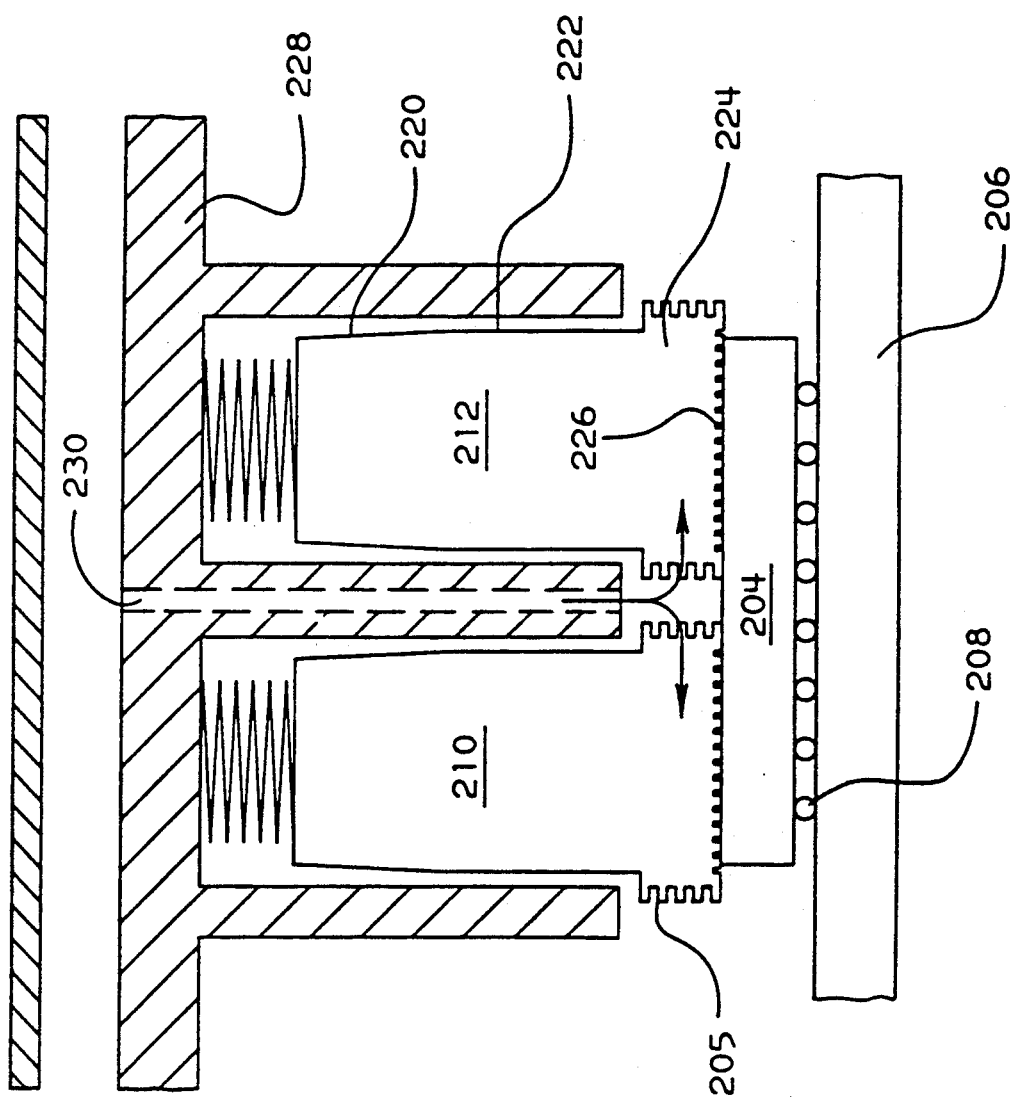
FIG. 2 is a cross sectional side view of a first embodiment of a piston cluster according to the present invention.

Referring to FIG. 2 a cross sectional view of a piston cluster having super-position cooling is illustrated. An integrated circuit chip 204 is mounted to a substrate 206 using solder balls 208. As is best illustrated in the top view of FIG. 3, the surface of the chip 204 is contacted by an array of four metal pistons 210–216 which are individually spring loaded.

As best illustrated in FIG. 2, the pistons 210–216 have a tapered upper portion 220, a cylindrical center portion 222, and a square foot 224 at the bottom which contacts the chip 204. Microfins 205 which protrude from the header sections of each piston are provided to further increase the area for heat transfer. Grooves 226 are formed in the chip contacting surfaces of each piston to insure wetting of the chip-piston interface. It should be understood that the grooves 226 are preferably provided where a single phase (non boiling) coolant is used and eliminated where a two phase (boiling) coolant is used.

Referring again to FIG. 2, a hat 228 overlies the substrate 206 and provides a partial enclosure for the chip 204 and the pistons 210–216. The hat 228 is arranged to carry a liquid dielectric coolant, such as liquid nitrogen or fluorocarbon, to the chips on the substrate 06 and to carry away the coolant that has flowed to the chips. If a boiling liquid is used in the module, the module is arranged to condense and/or carry off the vapor. The hat 228 can comprise a lower plate that is thick enough to carry blind holes for the pistons and an upper thin plate that is spaced from the lower plate to form the coolant distribution plenum.

Advantageously, since participation of the hat in the presently described cooling process is negligible, the hat material does not need to be a good thermal conductor. The hat 228 can be made of any material that is compatible with the coolant and with the mechanical requirements of the module. In the case of a ground-up chip design (where the back of each chip must be kept at the same potential) the hat is preferably made of an electrically conductive material such as copper or aluminum. In applications where the hat need not be electrically conductive, it can be injection molded from plastic thus saving significant manufacturing cost.

Figure 3:
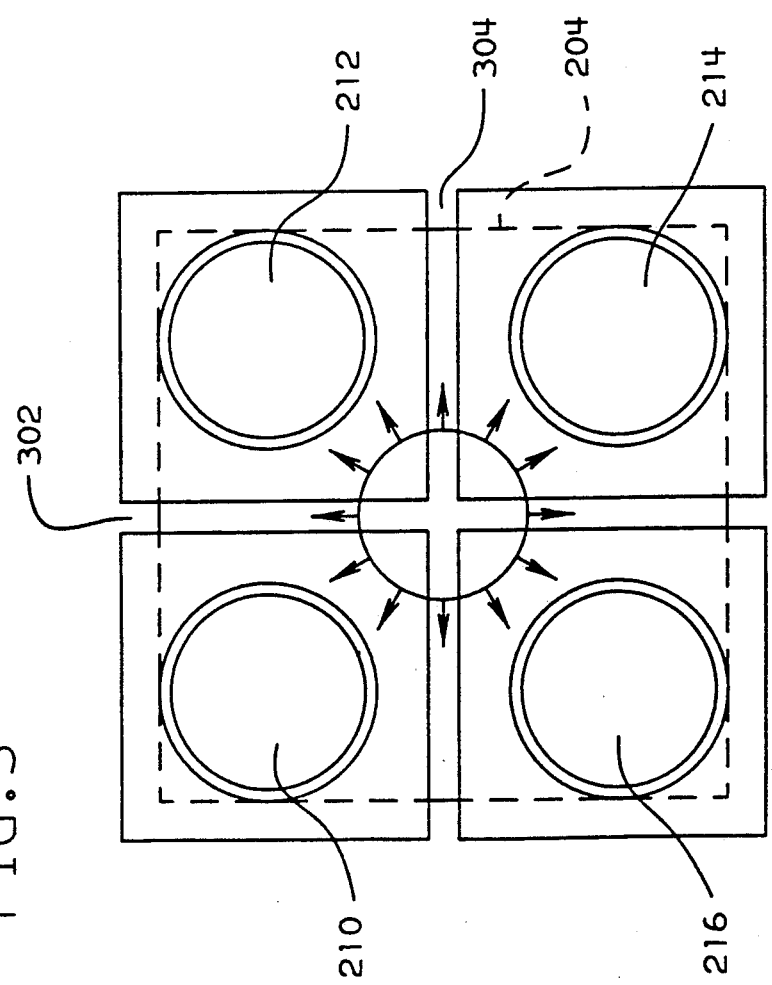
FIG. 3 is a top view of the piston cluster of FIG. 2 showing the pistons and the chip.

In a preferred embodiment, a cylindrical duct 230 is formed in the hat in the area between the holes for each cluster of pistons. As illustrated in FIG. 3, the headers of the pistons form a rectangular pattern which extends beyond the perimeter of the chip 204. The spaces between the feet form perpendicular channels 302, 304 where flowing coolant can contact the chip. The coolant flows down the cylindrical duct 230 and is delivered at the center of each four piston cluster. The coolant impinges on the chip and flows over the top of the headers 224 and in the channels 302, 304 between the headers, thus providing jet enhanced convective cooling at the lower portion of the pistons. The pistons serve as extended surfaces. Since the area for forced convection is increased, the cooling is greater than if the fluid were to cool the chip directly. The upper portion of each piston is also cooled by immersion in the coolant.

Figure 8:
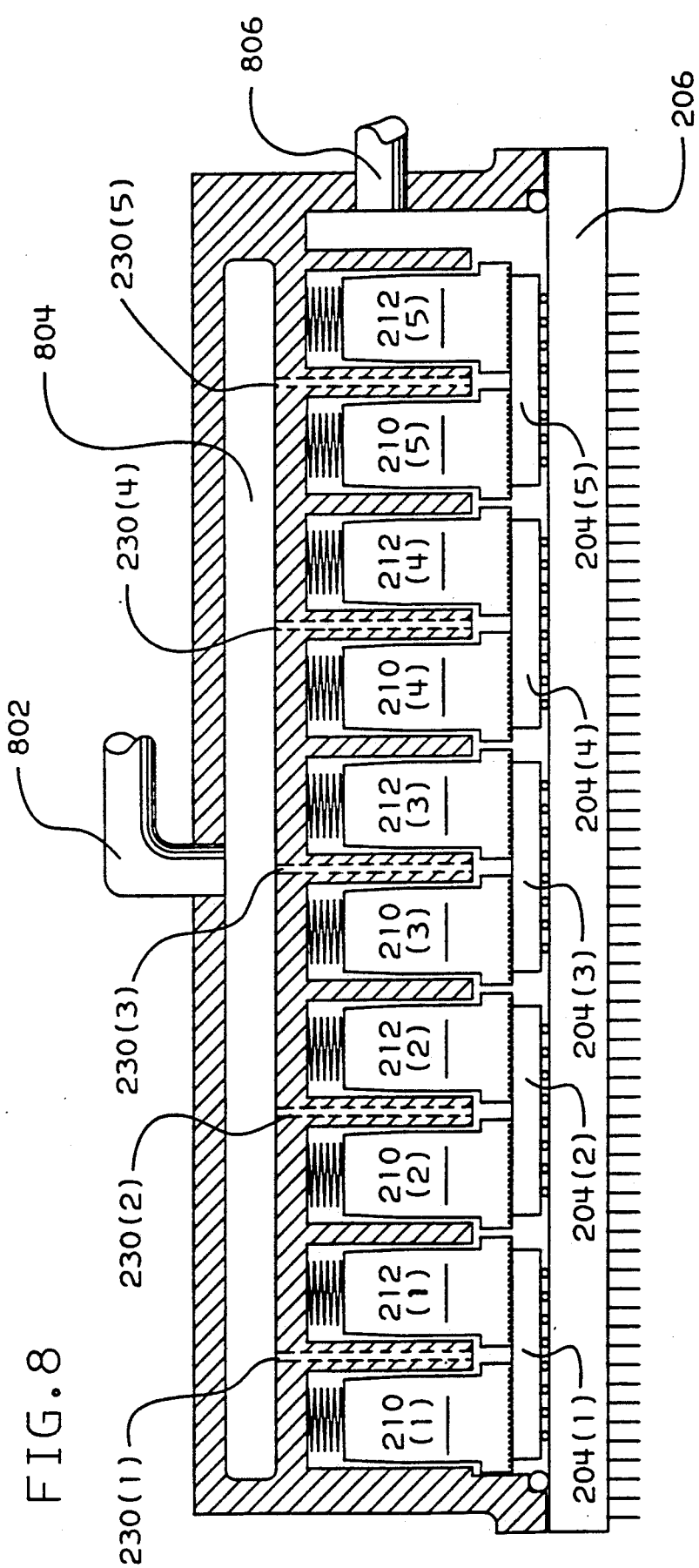
FIG. 8 is a cross sectional view of an embodiment of an improved electronic circuit cooling module incorporating super position cooling.

FIG. 8 is a cross-sectional side view of a thermal conduction module embodying the cooling system described above. A liquid dielectric coolant enters the module under pressure through an inlet 802 and flows into a distribution plenum 804. From the distribution plenum 804 the coolant flows down into the cylindrical ducts 230(1)–230(5) and impinges directly on the chips 204(1)–204(5) and flows over the feet of the pistons 210(1)–212(5). After picking up heat from the semiconductor chips and the pistons, the coolant exits the module through an outlet 806.

Figure 5:
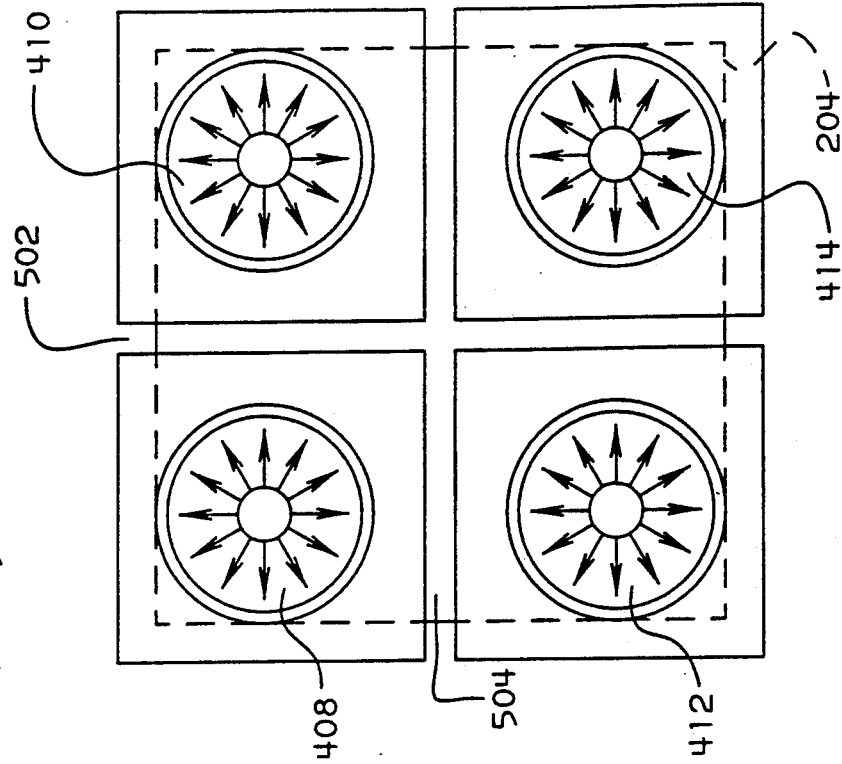
FIG. 5 is a top view of the piston cluster of FIG. 4 showing the pistons and the chip.
Figure 4:
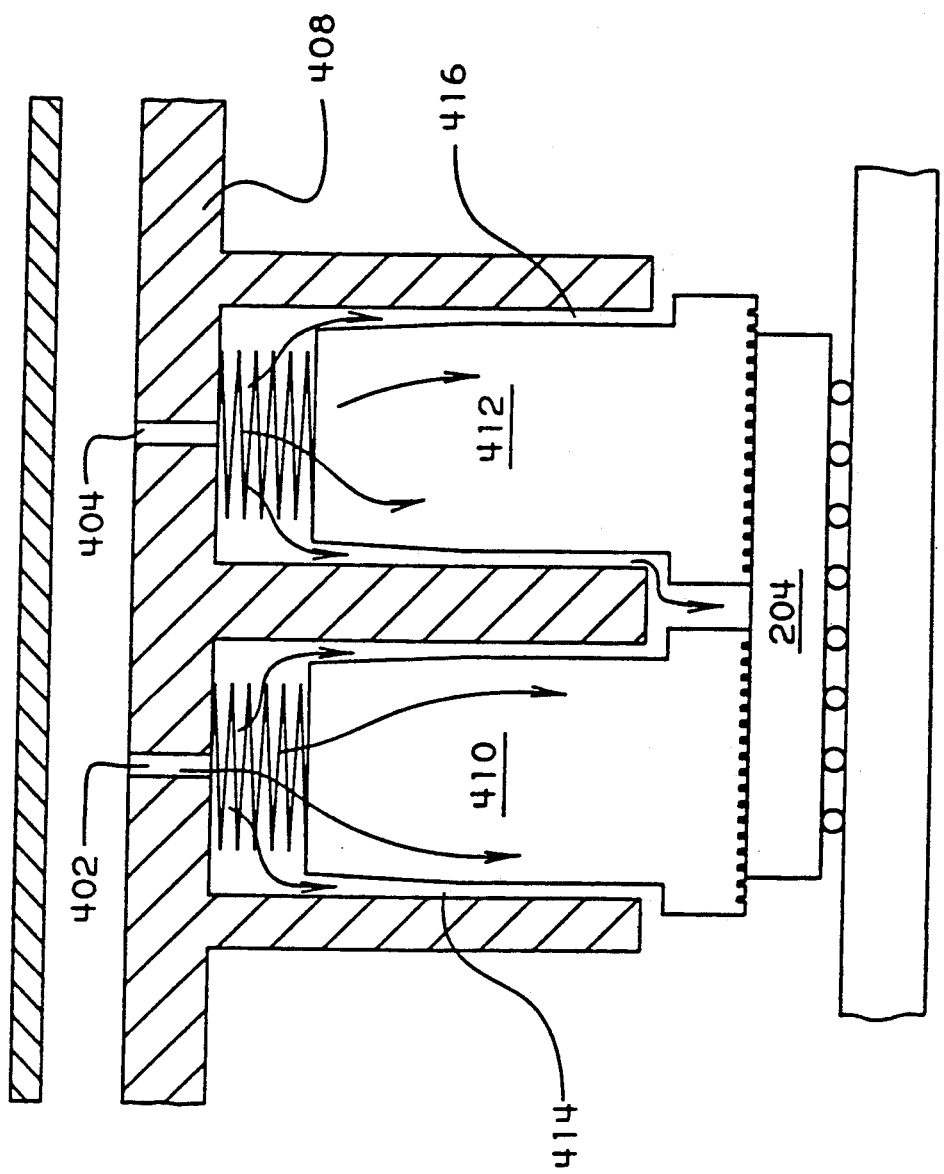
FIG. 4 is a cross sectional side view of a second embodiment of a piston cluster according to the present invention, wherein the coolant impinges on the pistons through a hole in the hat centered over each piston.

FIGS. 4 and 5 depict an alternative embodiment of the piston arrangement of FIGS. 2 and 3. In the embodiment of FIG. 4, the coolant is delivered to the top of the pistons 410, 412 through cylindrical ducts 402, 404 which are formed in the hat 408 over the center of each of the pistons 410, 412. The coolant impinges on the tops of the pistons 410, 412. This provides convective cooling of the upper portion of the pistons. After impinging on the tops of the pistons, the coolant flows down the gaps 414, 416 between the pistons and the piston openings. The coolant then impinges on the piston headers and onto the exposed surface of the chip 204 through channels 502, 504 (FIG. 5) formed by the piston headers. This provides convective cooling of the lower portions of the pistons and the chip.

Figure 6:
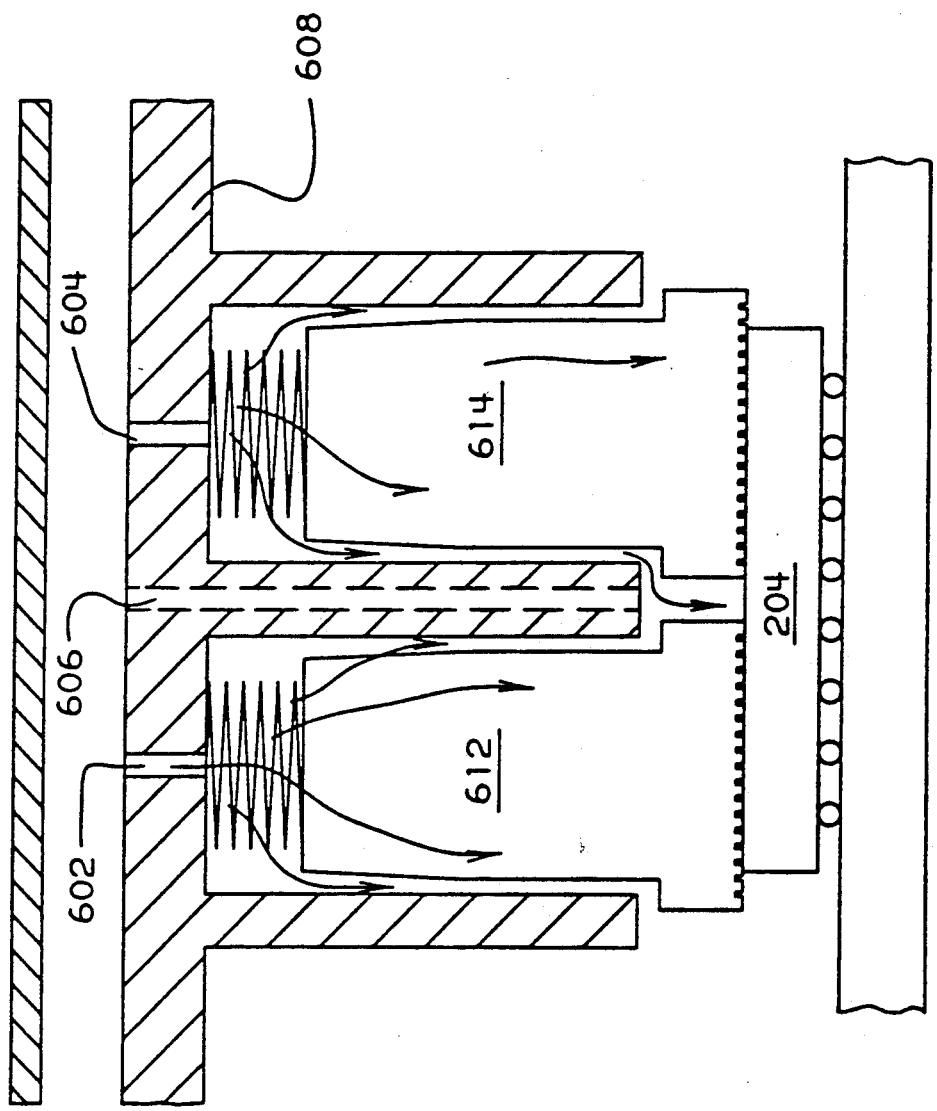
FIG. 6 is a cross sectional side view of a third embodiment of a piston cluster according to the present invention wherein the coolant impinges on the chip through a hole in the hat in the center of the piston cluster, and on the pistons through a hole in the hat centered over each of the pistons.
Figure 7:
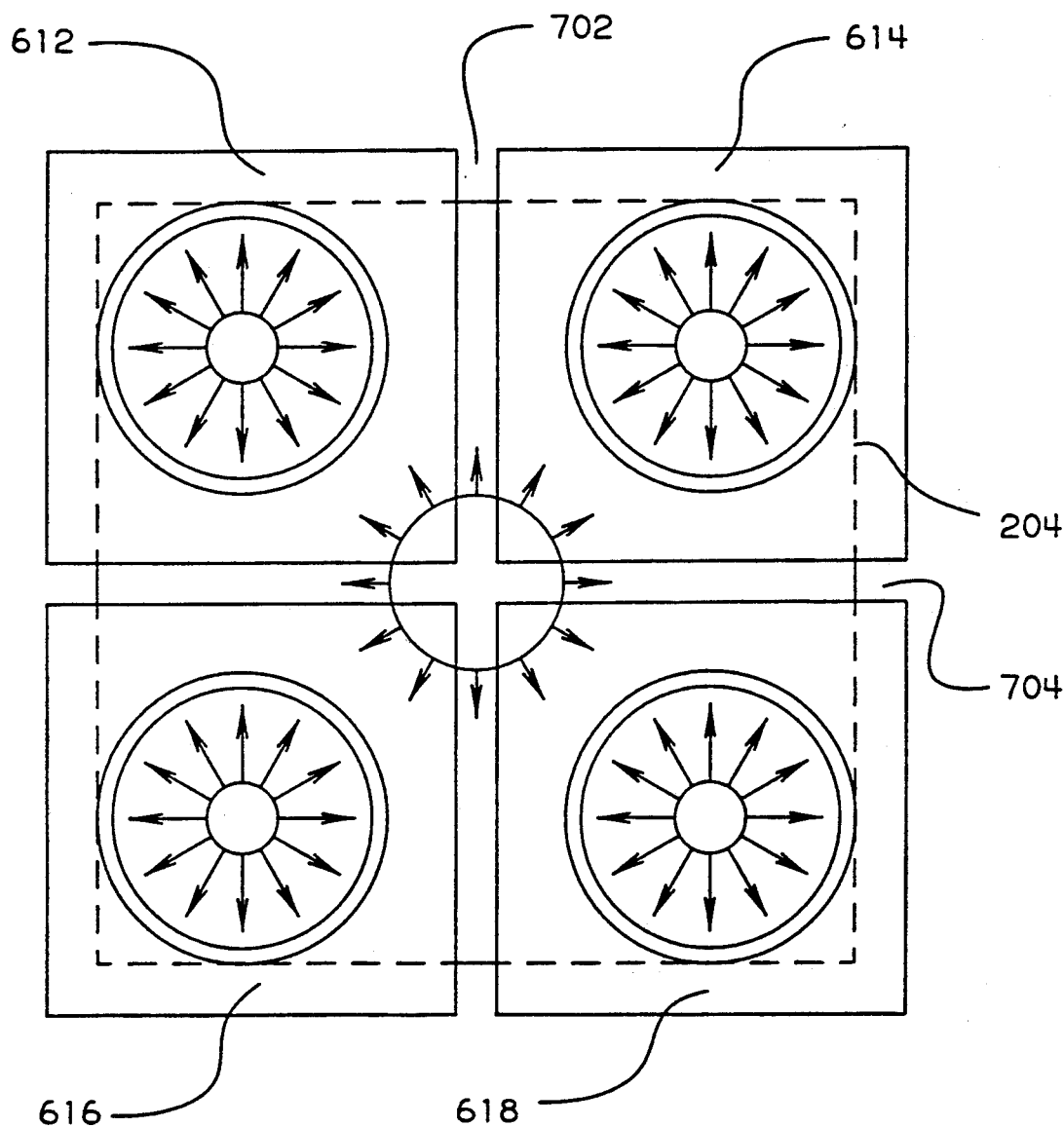
FIG. 7 is a top view of the piston cluster of FIG. 6 showing the pistons and the chip.

Yet another embodiment of the piston arrangements, depicted in FIGS. 6 and 7 includes coolant flow to both the top of each piston and the center of each piston cluster. In the embodiment of FIG. 6 and 7, the coolant flows through a set of cylindrical ducts 602, 604 centered above each of the pistons 612, 614 and through another cylindrical duct 606 formed in the hat material between the pistons. As illustrated in FIG. 7, the coolant impinges directly on the pistons 612-618 and also on the chip 204 in the center of the channels 702, 704 formed by the piston headers.

Figure 9:
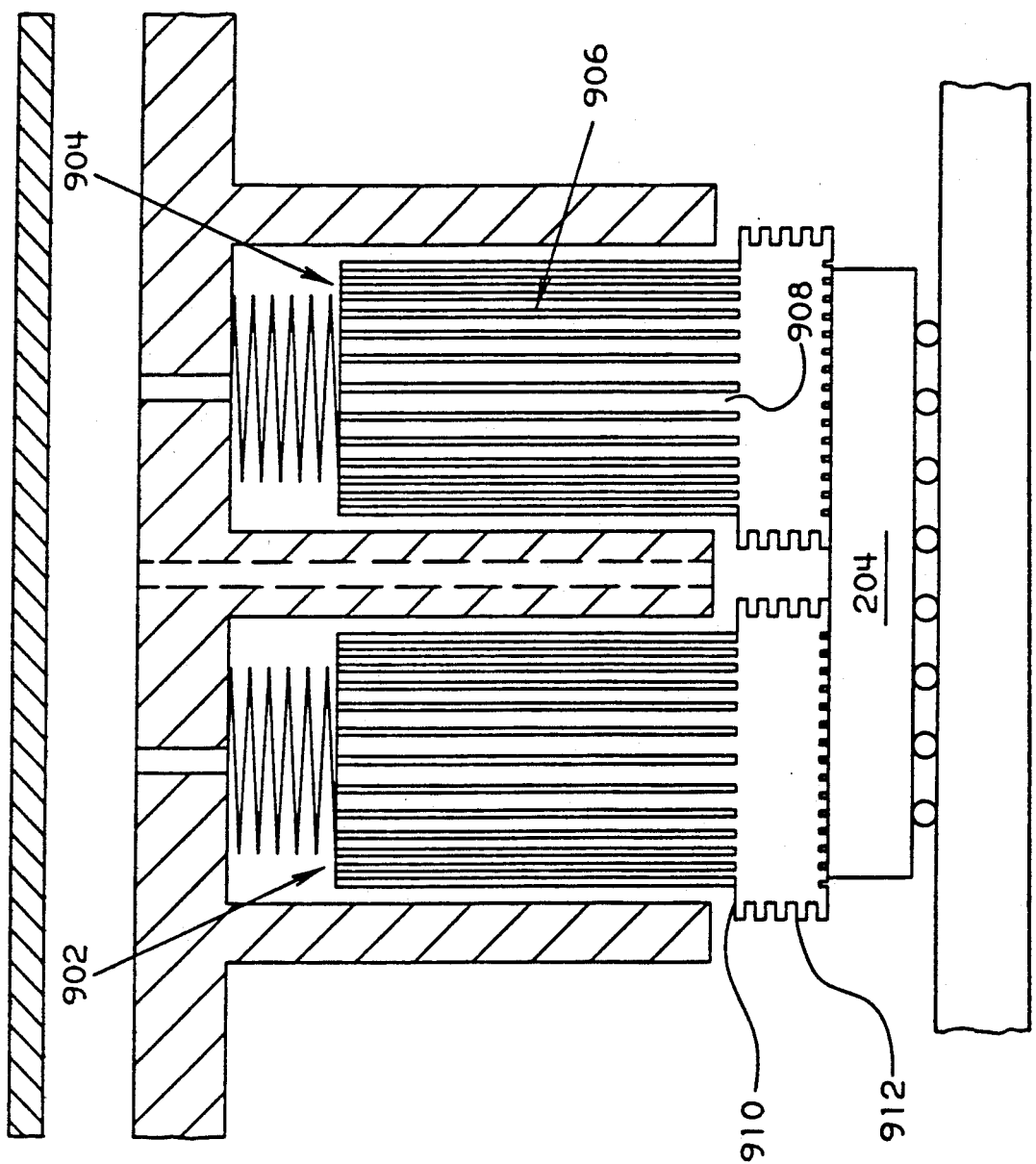
FIG. 9 is a cross sectional side view of a fourth embodiment of a piston cluster according to the present invention wherein the pistons include both upper and lower microfins.
Figure 10A:
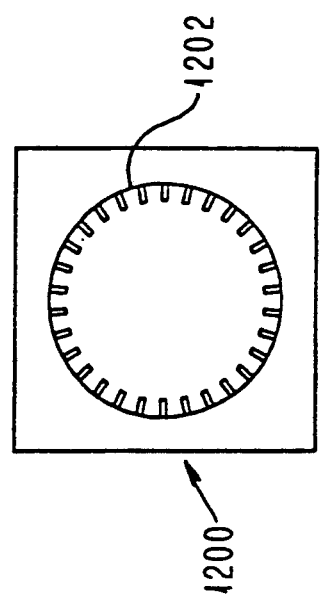
FIGS. 10A and 10B are, respectively, top and side views of an embodiment of a piston according to the present invention, having longitudinal upper piston microfins covering the upper portion of the piston.
Figure 10B:
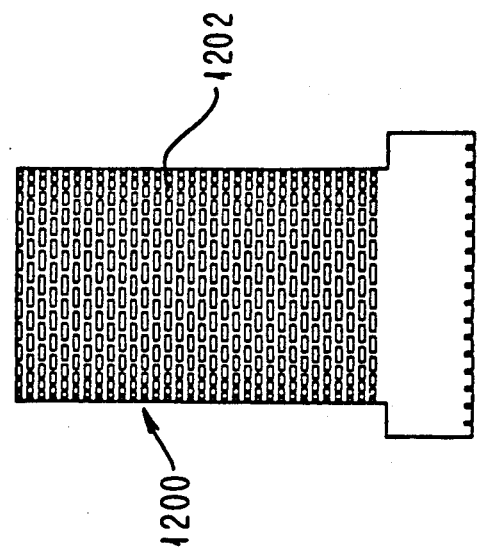

The shape and fin configuration of the pistons themselves can also be varied. FIG. 9 is a cross sectional side view of a piston cluster according to the present invention wherein the pistons 902, 904 include an upper cylindrically shaped portion 906 having longitudinally disposed microfins 908 and a rectangular chip contacting header 910 having microfins 912 disposed around the perimeter. Similarly, FIGS. 10A & 10B are, respectively, top and side views of an embodiment of a piston 1000 according to the present invention, having longitudinal upper piston microfins 1002 covering the upper portion of the piston and no microfins on the header.

As a further enhancement to the embodiment of FIG. 9, longitudinal microfins can be provided on the inner walls of the openings in the hat that receive the pistons. In such an embodiment, the longitudinal microfins are preferably disposed to mesh with those on the upper portion of the pistons, thus increasing the surface area for heat transfer as the coolant passes through the meshed area.

Figure 11A:
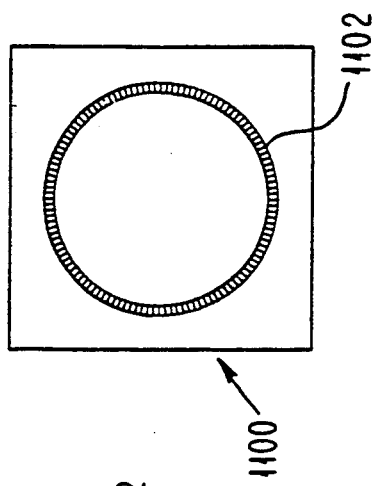
FIGS. 11A and 11B are, respectively, top and side views of an embodiment of a piston according to the present invention, having a staggered array of diamond shaped microfins covering the upper portion of the piston.
Figure 12A:
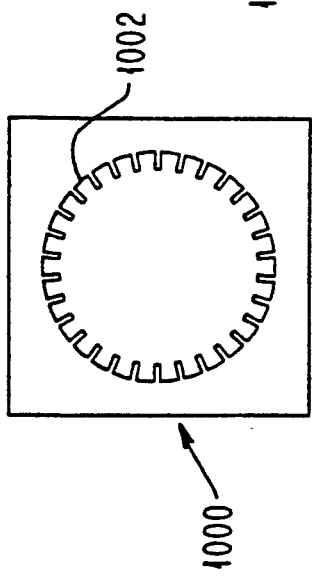
FIG. 12A and 12B are, respectively, top and side views of an embodiment of a piston according to the present invention, having a staggered array of brick shaped microfins covering the upper portion of the piston.
Figure 11B:
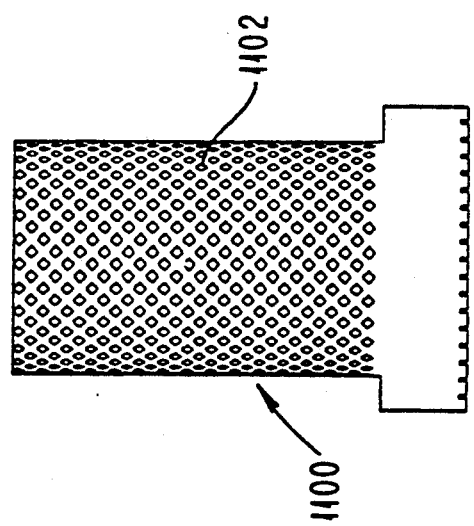
Figure 12B:
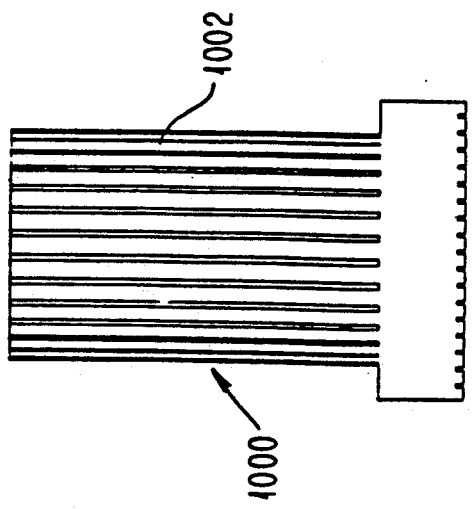

The shape of the fins can also be varied. For example, FIGS. 11A & 11B are, respectively, top and side views of an embodiment of a piston 1100 according to the present invention, having a staggered array of diamond shaped microfins 1102 covering the upper portion of the piston. FIGS. 12A & 12B are, respectively, top and side views of yet another embodiment of a piston 1200 according to the present invention, having a staggered array of brick shaped microfins 1202 covering the upper portion of the piston.

Advantageously, the principles described above can be used to customize cooling from one chip to another or on a single chip. The heat dissipated by neighboring chips may vary significantly. The chip to chip temperature variation is, however, preferably kept small. It is therefore advantageous to customize cooling by reducing the cooling for low power chips and increasing the cooling for high power chips.

In order to meet the above described goals the embodiments of FIGS. 2-8 can be modified in a variety of ways. For example, the points of entry for flow to the piston cluster may be varied. No flow might be necessary for a very low power chip. In contrast, the highest power chips may require coolant delivered to the center of each cluster as well as the top of each piston. Further, either one of the cluster centered jets or piston centered jets may be sufficient for many chips.

As another modification, the flow delivered to each jet may be varied by, for example, varying the diameter of the cylindrical ducts. Further, the selection of piston material will effect cooling. A copper piston, for example, might be deployed over high power chips. Pistons made from metals with lower thermal conductivity, aluminum for example, would be deployed over chips that dissipate less power.

The extent to which microfins are used in the pistons can also be varied. Microfins can be provided on either the header or the upper portion of the piston, on both the header and the upper portion of the piston, or not at all.

As chips become larger, the likelihood of significant variations in the local dissipation of heat across a single chip increases. The present invention is also well suited to customization to maintain a uniform temperature across a single chip. This can be accomplished by taking advantage of the same mechanisms for cooling customization listed above. Instead of varying the controlling parameters from chip to chip, they would be varied from piston to piston so that more or less power can be dissipated at the same chip temperature over all regions of the chip. For example, the cylindrical ducts which supply the coolant jet to a given array could each be of a different diameter, or the pistons within each array could be made of materials having different amounts of thermal conductivity (e.g. copper and aluminum).

Many other modifications and variations that do not depart from the scope and spirit of the invention will now become apparent to those of skill in the art. Thus, it should be understood that the above-described embodiments of the invention have been described by way of example and not as a limitation.

We claim:

1. An electronic circuit cooling module comprising:
   a substrate carrying a plurality of integrated circuit chips;
   a hat cooperating with the substrate to form an enclosed space for the chips, the hat having coolant distribution plenum formed therein, the coolant distribution plenum having a floor separating it from the enclosed space, the floor having a plurality of blind holes formed therein and disposed between the substrate and the coolant distribution plenum and further having at least one cylindrical duct formed between the coolant distribution plenum and the enclosed space; and
   an array of heat conducting pistons, each of the pistons comprising an upper portion disposed at least partially in one of the blind holes and a lower rectangular shaped portion, the lower rectangular shaped portions of at least some of the pistons cooperating to form a combined area making contact with one of the chips, the combined area being of grater area than that of said one of the chips and having a plurality of channels formed therein along the surface of said one of the chips;
   wherein the at least one cylindrical duct is disposed in between the blind holes so as to deliver a coolant jet to the rectangular shaped portions of the pistons in the array and to a portion of the one of the chips exposed by the channels.

2. The electronic circuit cooling module of claim 1, wherein the lower rectangular shaped portions of the pistons comprise a plurality of grooves formed thereunder.

3. The electronic circuit cooling module of claim 1, wherein the lower rectangular shaped portions of the pistons comprise microfins.

4. The electronic circuit cooling module of claim 1, wherein the coolant jet comprises any of liquid nitrogen and fluorocarbon.

5. The electronic circuit cooling module of claim 1, wherein the plurality of channels intersect at a center of said one of said chips and wherein the cylindrical duct is disposed to deliver a coolant jet to the center.

6. The electronic circuit cooling module of claim 1, wherein the at least one cylindrical channel connects the coolant distribution plenum to one of the blind holes.

7. The electronic circuit cooling module of claim 1, wherein a first piston in the array comprises a first material having a first thermal conductivity and a second piston in the array comprises a second material having a second thermal conductivity different from the first thermal conductivity.

8. The electronic circuit cooling module of claim 1, wherein a first piston in the array is aluminum and a second piston in the array is copper.

9. The electronic circuit cooling module of claim 1, further comprising: a plurality of the arrays of pistons, wherein each array of pistons is of a material having a different thermal conductivity.

10. The electronic circuit cooling module of claim 1, wherein the hat is plastic.

11. The electronic circuit cooling module of claim 1, wherein the hat is metal.

12. The electronic circuit cooling module of claim 1, wherein the upper portion of at least one of the pistons comprises longitudinal fins disposed thereon.

13. The electronic circuit cooling module of claim 1, wherein the upper portion of at least one of the pistons comprises a plurality of diamond shaped fins disposed thereon 14. The electronic circuit cooling module of claim 1, wherein the upper portion of at least one of the pistons comprises a plurality of brick shaped fins disposed thereon.

15. The electronic circuit cooling module of claim 1, wherein the at least one cylindrical duct comprises a plurality of cylindrical ducts disposed between the coolant distribution plenum and a center of each of the blind holes, and an additional cylindrical duct disposed between the coolant distribution plenum and the center of the array.

16. An electronic circuit cooling module comprising:
a substrate carrying a plurality of integrated circuit chips;
a hat cooperating with the substrate to form an enclosed space for the chips, the hat having a coolant distribution plenum formed therein, the coolant distribution plenum having a floor separating it from the enclosed space, the floor having a plurality of blind holes formed therein and disposed between the substrate and the coolant distribution plenum and further having at least one cylindrical duct formed between the coolant distribution plenum and the enclosed space;
an array of heat conducting pistons, wherein each of the pistons comprises an upper portion disposed at least partially in one of the blind holes and comprising a plurality of fins disposed thereon, and a lower rectangular shaped portion; the lower rectangular shaped portions of at least some of the pistons co-operating to form a combined area making contact with one of the chips;
wherein the at least one cylindrical duct connects the coolant distribution plenum to at least one of the blind holes such that coolant will flow over the upper portion of at least one of the pistons.

17. A electronic circuit cooling module, comprising:
a substrate carrying an array of integrated circuit chips;
a hat cooperating with the substrate to form an enclosed space for the integrated circuit chips;
an array of pistons in contact with one of the chips, each of the pistons comprising an upper cylindrical shaped portion disposed in the hat and a lower rectangular shaped header portion in contact with said one of the chips;
the hat further comprising,
first jet means, disposed above each of the pistons, for supplying a first jet of a cooling fluid to the upper cylindrical shaped portion of the pistons; and
second jet means, not connected to pistons in the array and disposed centrally between the pistons in the array, for supplying a second jet of the cooling fluid to the header portion of each of the pistons and to an exposed area of the chip.

18. The electronic circuit cooling module of claim 17, wherein:
the first jet means comprises a cylindrical channel of a first diameter and the second jet means comprises a second cylindrical channel of a second diameter, said first diameter being different from said second diameter.

* * * * *